United States Patent
Kafri

[11] Patent Number: 5,801,848
[45] Date of Patent: Sep. 1, 1998

[54] PROCESS FOR TRANSMITTING AND/OR STORING INFORMATION

[75] Inventor: Oded Kafri, Beer-Sheva, Israel

[73] Assignee: Fontech Ltd., Beer-Sheva, Israel

[21] Appl. No.: 461,131

[22] Filed: Jun. 5, 1995

Related U.S. Application Data

[63] Continuation of Ser. No. 1,076, Jan. 6, 1993.
[51] Int. Cl.[6] .......................................... H04N 1/40
[52] U.S. Cl. ..................... 358/470; 358/476; 358/426; 358/456; 358/444; 235/494; 395/114; 382/232
[58] Field of Search .......................... 358/444, 476, 358/426, 470, 456, 443; 382/232; 395/114; 235/494

[56] References Cited

U.S. PATENT DOCUMENTS

| | | |
|---|---|---|
| 2,952,080 | 9/1960 | Avakian et al. . |
| 4,004,089 | 1/1977 | Richard et al. . |
| 4,229,817 | 10/1980 | Morgan et al. . |
| 4,241,415 | 12/1980 | Masaki et al. . |
| 4,470,073 | 9/1984 | Nakamura et al. . |
| 4,533,956 | 8/1985 | Fedde . |
| 4,776,013 | 10/1988 | Kafri et al. . |
| 4,796,298 | 1/1989 | MacArthur . |
| 4,809,297 | 2/1989 | Polansky et al. . |
| 4,837,812 | 6/1989 | Takahashi et al. . |
| 4,881,129 | 11/1989 | Mitsuhashi . |
| 4,896,355 | 1/1990 | Iggulden et al. . |
| 4,912,761 | 3/1990 | Tan et al. . |
| 4,949,381 | 8/1990 | Pastor . |
| 4,992,886 | 2/1991 | Klappert . |
| 4,996,707 | 2/1991 | O'Malley et al. . |
| 5,007,016 | 4/1991 | Le Méhauté et al. . |
| 5,050,213 | 9/1991 | Shear . |
| 5,072,310 | 12/1991 | Yamamoto et al. ........... 358/444 |
| 5,121,391 | 6/1992 | Paneth et al. . |
| 5,152,003 | 9/1992 | Poch . |
| 5,191,603 | 3/1993 | Kafri . |
| 5,313,564 | 5/1994 | Kafri et al. . |

FOREIGN PATENT DOCUMENTS

| | | |
|---|---|---|
| 0027572 | 4/1981 | European Pat. Off. . |
| 0466146A2 | 1/1992 | European Pat. Off. . |

OTHER PUBLICATIONS

McConnell, Kenneth R., Dennis Bodson, and Richard Schophorst, FAX. *Digial Facsimile Technology and Applications*, Artech House, Inc., 1992.

*Primary Examiner*—Edward L. Coles, Sr.
*Assistant Examiner*—Mark Wallerson
*Attorney, Agent, or Firm*—Merchant, Gould, Smith, Edell, Welter & Schmidt, P.A.

[57] ABSTRACT

A process for the transmission and/or storage of information defined in digital form comprises transforming the clear file, containing said information, to graphic equivalent form, transmitting and/or storing the same in such graphic-equivalent form and bringing it back to digital form.

19 Claims, 7 Drawing Sheets

1 0 1 0 1 1 0 1

1 1 1 0 1 1 0 0

0 0 1 0 0 1 1 1

0 0 0 1 1 1 0 0

```
1  0  1  0  1  1

1  0  0  1  0  0

1  1  1  1  0  1

1  0  1  1  0  0
```

PROCESS FOR TRANSMITTING AND/OR STORING INFORMATION

This is a File Wrapper Continuation application of application Ser. No. 08/001,076, filed Jan. 6, 1993.

FIELD OF THE INVENTION

This invention relates to a process for transmitting and/or storing information. It particularly refers to the transmission of computer files from computer to computer, directly or via fax (telecopier), as well as to the storing of information contained in computer files in preferably in highly compressed, graphic or other form. It also refers to transmission of information from computer to fax, directly or via fax. It further refers to applying information in graphic form to documents or cards for certification or identification purposes. It further refers to the transmission and/or storage of pictures, both black and white and color. In general, it refers to the processing of information that can be represented by computer files.

BACKGROUND OF THE INVENTION

The processing of information, for transmission or storage or other purposes, is one of the basic problems of modern technology. Each known processing method has its specific drawbacks.

Transmission in graphic form from fax to fax is time-consuming and is expensive because of the cost of transmission over telephone lines. It is further subject to disturbances due to noise, as well as to printing defects, and does not in general guarantee confidentiality and privacy. Transmission from computer to computer via modems requires that the two communicating computers operate a kind of handshake, defining the one among many possible protocols that is to be used for that specific transmission, and then remain connected and occupied during the entire transmission. Further, errors due to noise occurring in the transmission can generally be detected but not corrected, and a defective transmission must be repeated. Furthermore, known compression methods can hardly be applied to information that has to be transmitted in this manner, because any error in transmission will make the compressed information unreadable when decompressed. Known methods for the storage of compressed information are also not wholly satisfactory, both when the information is to be stored in graphic or electronic form.

European Patent Application No. 91111531.9, the contents of which are incorporated herein by reference, discloses an apparatus for composing a printable text, comprising coded characters which comprises: A - a text-composing device; B - a memory for storing character grids, representing clear characters arranged in at least a coded font; and C - means associated with said text-composing device for selecting characters or character grids, as desired. It further describes a process for composing a printable text, comprising coded characters and graphic matter obtained thereby by means of the said apparatus.

It is a purpose of this invention to overcome the drawbacks of previously known methods and means for transmitting and/or storing and in general processing information.

It is another purpose of this invention to overcome the drawbacks of said previously known methods and means due to noise, and in general to inaccurate transmission and/or printing.

It is a further purpose of this invention to permit a high compression of the information to be transmitted and/or stored.

It is a still further purpose of this invention to permit transmission of information with any degree of secrecy, and thus to permit identification of documents and cards, electronic signatures and the like.

It is a still further purpose of this invention to eliminate the need for the connection in real time, during transmission, between transmitting and receiving apparatus.

It is a still further purpose of this invention to eliminate the need for the use of a variety of special protocols.

It is a still further purpose to permit sending information by means of a computer or fax apparatus and receive it by means of another computer or a fax apparatus, as desired, without the need of establishing any particular protocol.

It is a still further purpose of this invention to permit transmission, and/or storage of information, wherein known processing and in particular compression methods are applied to the transmitted and/or stored information.

It is a still further purpose of this invention to achieve all the aforesaid purposes in transmitting and/or storing any information that can be incorporated in a computer file. It is a still further purpose of this invention to achieve all the aforesaid purposes by using conventional hardware.

SUMMARY OF THE INVENTION

The information to be stored or transmitted by the process of this invention is defined in digital form. It constitutes what will be called a "clear file". By "clear file" is meant the file that it is actually wished to transmit and/or store, and which may in fact be a coded or compressed file or have undergone any transformation unrelated to the process of the invention. The clear file is transformed to graphic-equivalent form—wherein the expression "graphic-equivalent form" has the meaning that will be defined hereinafter—is transmitted or stored in such graphic-equivalent form and is finally brought back to digital form. When the invention is applied to a transmission of information, the above steps are usually carried out in close succession. When it is used for storing information, said information may remain in graphic-equivalent form for a long time and be brought back to digital form only when it is necessary to interpret it. The said graphic-equivalent form, defined on a backing, which may be a sheet of paper in the case of a print or an element capable of storing magnetic, electronic, optical or other information, is also an object of this invention, as an article of manufacture.

The expression "graphic-equivalent" form includes properly graphic forms, such as a print, arrays of instructions, such as a computer files, which contain all the information required for producing a print, and any form of registered information that can be used to produce a print or can be transduced into an array of instructions, such as a computer file, which contains all the information required for producing a print. To transform a clear file into graphic-equivalent form, the file is formated in such a way that the bits thereof which define an element of the file (or, as will be said hereinafter, a "file unit") constitute an ordered array. Preferably the number of the arrays which are may possibly represent file elements, viz. which are conventionally accepted as representing file elements, when these latter appear, should be less than the number of possible arrays having the same number of component bits, and more preferably the ratio of the two numbers should be at least 64, preferably at least 128 and still more preferably at least 256. According to another preferred aspect of the invention, the graphic-equivalent form is obtained by grouping the bits representing a file element into a plurality of associated bytes. In this case, a typical graphic form obtained by printing the graphic-equivalent form would be a matrix, the rows or columns whereof are the aforesaid bytes.

The various possible graphic-equivalent forms (or formats) will be better understood as the description proceeds.

When said graphic-equivalent form is a graphic form proper, it is usually defined by a grid, made up of black and white cells, each corresponding to a binary digit, the array of binary digits representing the information to be transmitted and/or stored. In various embodiments of the invention the graphic-equivalent form of the information may be rendered visible either as a print or as a picture on a screen, or may not be visible and be merely registered in a computer memory, or again may be registered in a magnetic disk. When embodied in any way on any kind of material backing, which means any object on which the information contained in the graphic-equivalent form may be stored—paper, magnetic disk, compact disk or the like—said graphic-equivalent form provides an article of manufacture which is one of the aspects of this invention and is claimed herein:

In a specific, preferred form of the invention, the information to be transmitted and/or stored is embodied in a computer file consisting of file units. By "file unit" is meant an array of digital values to which a definite meaning is attributed when they are taken together. E.g., such a unit may be a byte of 8 zero and one (or white and black) values defining an ASCII symbol, or it may be an array of bits defining the position and color a pixel of a color picture, or an array of n digital values representing a number which has a geometrical or physical meaning, and so forth. Depending on the nature of the file units, each of them will require, to represent it, a byte comprising a minimum number of binary digits. Such a byte will be called a "basic byte". According to the invention, each file unit is represented by an array of binary digits in a number that is greater, preferably a multiple, and still more preferably at least twice or still more preferably three times, than the number of binary digits of the basic byte, a relative positioned relationship being attributed to said binary digits in said array by arranging them in a matrix or by attributing to them a certain order of succession, viz. a position number in a linear row, or by a combination of such means. The resulting number of arrays will be greater than that of the possible file units and the corresponding basic bytes, usually a large multiple thereof. Specifically, if the basic bytes comprise "n" bits and the arrays comprise "mn" bits, the possible arrays will be in the number of $2^{mn}$ while the possible file units and the corresponding basic bytes, will be in the number of $2^n$. Therefore, only a fraction of the possible arrays will represent file units. Those representing file units will be called hereinafter "legitimate" arrays.

Now, according to this preferred form of the invention, the process for transmitting and/or storing information comprises: 1—representing each file unit by a legitimate array, 2—transmitting each legitimate array and/or storing it in graphic-equivalent form, 3—analyzed the transmitted and/or stored array, 4—if it is a legitimate array, accepting the corresponding file unit as the true one, 5—if it is not, determining which is the closest legitimate array and accepting the corresponding file unit as the true one only if the difference between the actual array and the closest legitimate array does not exceed a certain predetermined limit.

In a preferred form of the invention, each array of binary digits transmitted and/or stored is transformed into a grid, wherein the cells of the grid representing each a binary digit, consist of a plurality of pixels. In reading a grid, the cells are examined in the appropriate succession. If, the grid as read is not a legitimate grid, the position at which its reading of the pixel has begun is shifted in all possible directions until a read grid that is sufficiently close to a legitimate grid is obtained; and if it is not obtained, the grid is registered as erroneous and impossible to interpret.

In the aforesaid statement it should be understood that a grid may also consist of a single row. "Grid" only means an array of bits for which a certain positioned order has been established. In a still preferred form of the invention, each unit of the clear file to be transmitted is represented by constructing a plurality of bytes—hereinafter "coded bytes"—each coded byte representing the basic byte of said unit according to a different predetermined correspondence rule. For each clear file unit, a matrix is constructed by taking the coded bytes are the matrix rows. The matrices are stored in a succession preferably determined by the succession of the file units in the clear file, whereby to generate a "coded file". The coded file is transmitted. The transmitted coded file is read and is decoded by applying the reverse of the aforesaid correspondence rules to each row (coded byte) and accepting the clear file unit meaning obtained by such decoding if it is the same for all rows or for a sufficient number thereof. If such file unit meanings are not the same for a sufficient number of rows, the starting point of the reading and decoding is shifted in all possible directions until an acceptable clear file unit meaning has been obtained, and if no acceptable meaning is obtained, the matrix is assumed to have no acceptable meaning. The process according to the invention may include or not include rendering the coded file visible or registering it in magnetic or other form.

Each of the aforementioned "correspondence rules" may entail any correspondence between digital values. It may be as simple as the unit (identity) or it may be complex and even random generated. The digital value arrays representing a file unit meaning may also not be generated in each case by using a code and be stored instead in a table established once and for all. The digital value arrays representing a file unit meaning will in general be different from one another, but this is not necessary, and two or more of them may be identical.

The storing of the matrices may be effected in various ways, e.g. electronically, optically or graphically. If the transmitting computer is directly connected to a receiving computer or fax apparatus, the coded file will be stored in the computer memory. If it is not so directly connected, the coded file may be stored in a hard memory, or optically in a compact disk, or it may be printed. By "reading the coded file" is meant detecting the digital data contained therein by any means suited to the form in which the coded file has been stored. Thus, if it is stored in a hard memory, the coded file will generally be read by the receiving computer; if it is stored in a compact disk, it will generally be read by a compact disk drive ; if it is printed, it will be read by means of a scanner or by a camera, and the scanner reading will be conveyed to a computer for decoding.

DETAILED DESCRIPTION OF PREFERRED EMBODIMENTS

Figure 8:
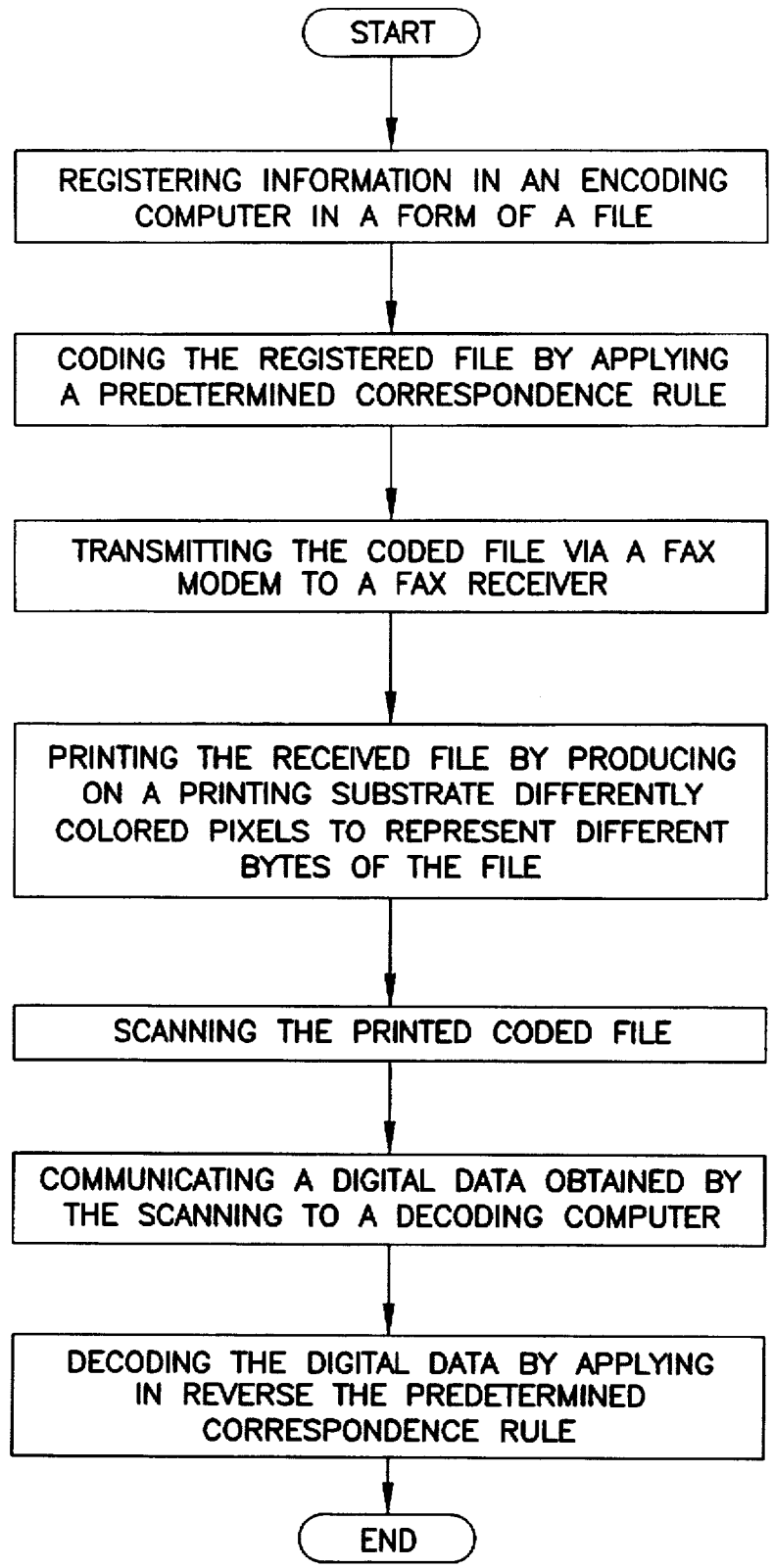
FIG. 8 is a flow chart represent a process for transmitting information in accordance with the present invention.
Figure 9A:
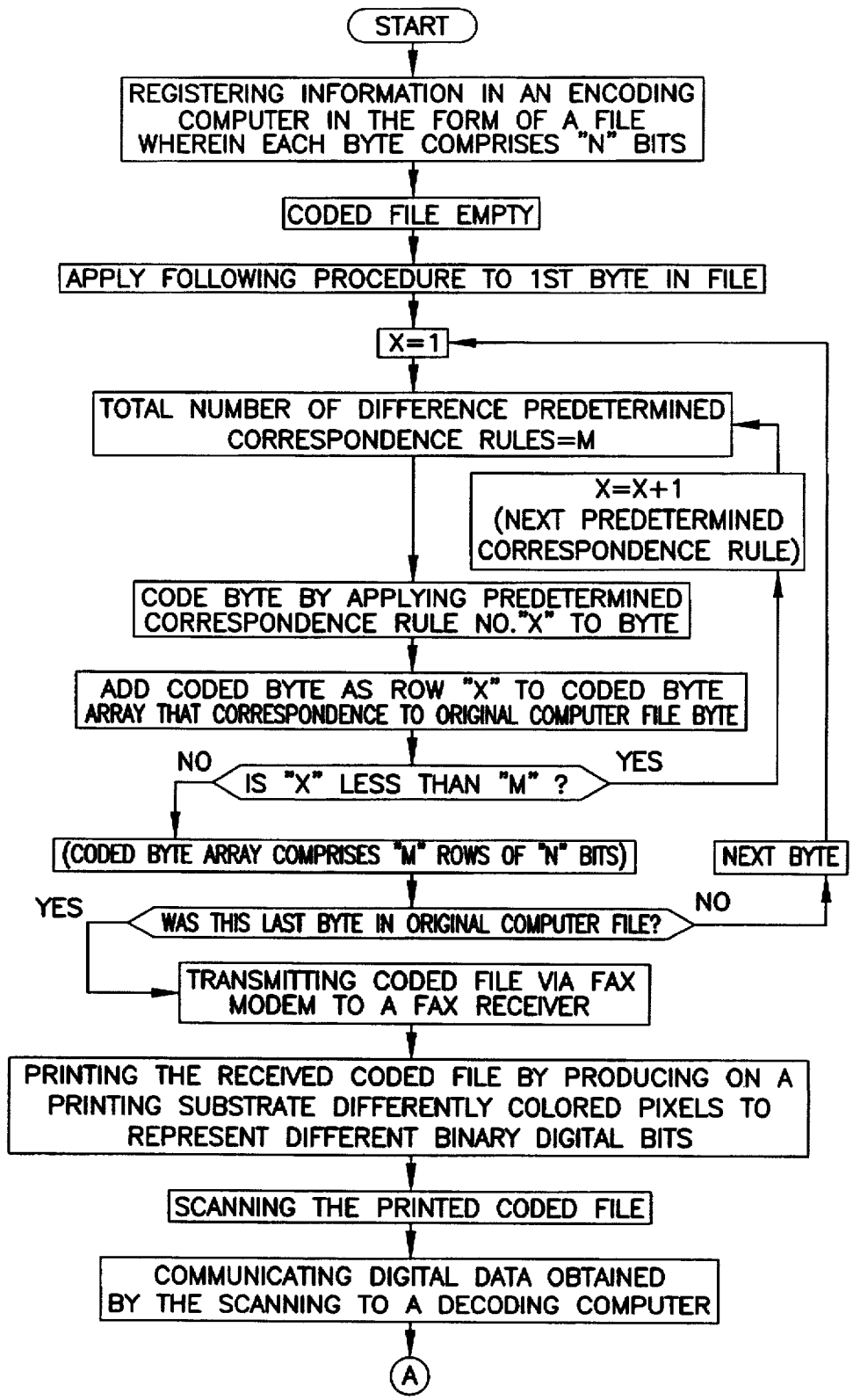
FIGS. 9A–9B is a flow chart represent a process for transmitting information in accordance with the present invention.
Figure 9B:
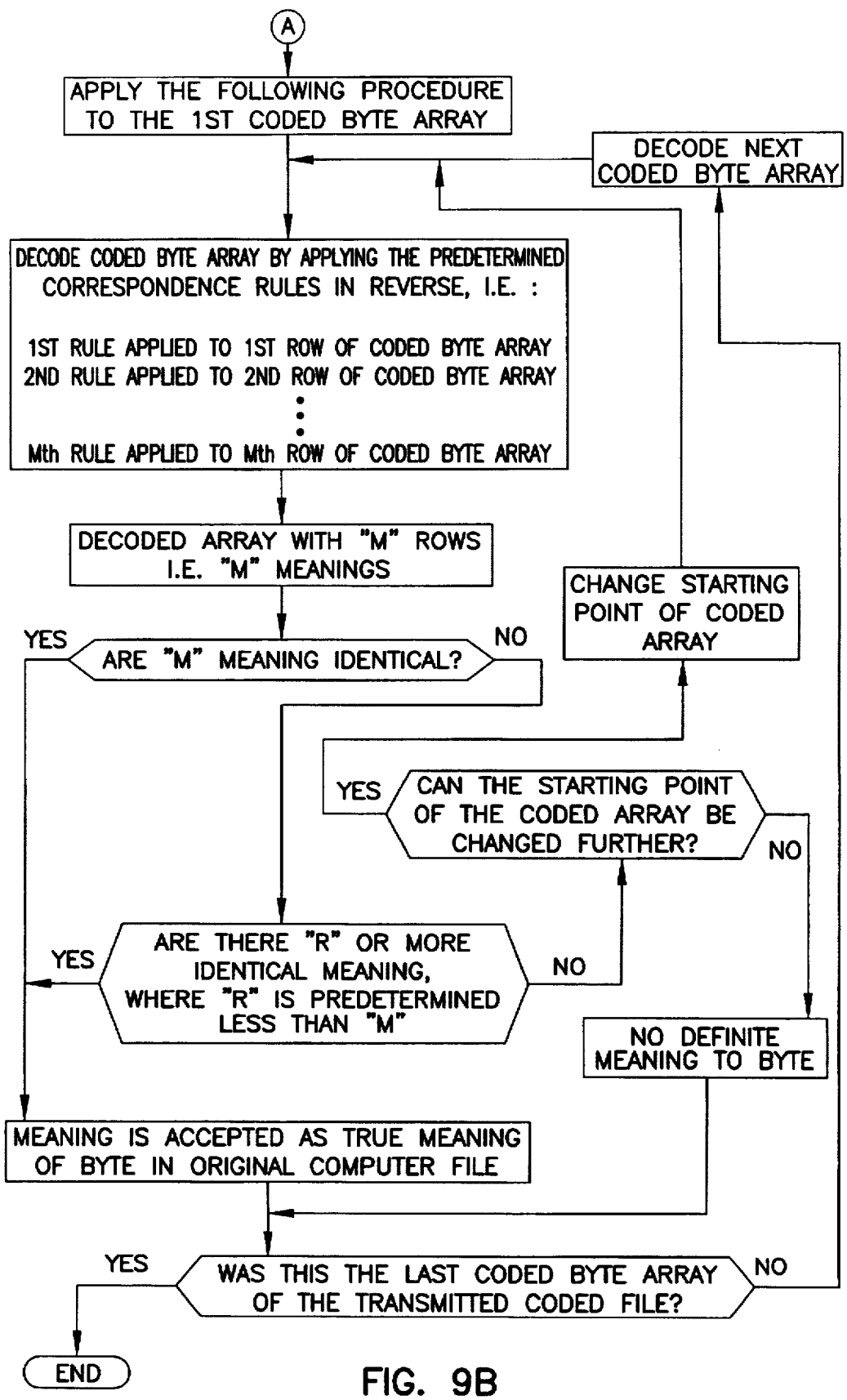

Some non-limitative embodiments of the invention will now be described for purposes of illustration. FIG. 8 generally illustrates a flow chart for transmitting information in accordance with the principles of the present invention as being described in the following non-limitative embodiments of the invention. In addition, FIGS. 9A–9B generally illustrates a flow chart for transmitting information in accordance with the present invention as being described in the following non-limitative embodiments of the invention.

EXAMPLE 1

It is desired to transmit or store the following clear file, which is contained in a computer's memory: "Crist. 12.34567.89.". A computer is used which is provided with at least one font according to the invention. The font (or each font, if there is more than one) is constructed as follows. For each of 256 ASCII symbols or characters, which in this example it is intended to use, four coded bytes are constructed as follows. The basic byte, conventionally representing the symbol or character, which is an 8-bit byte, is considered. In the case of the first letter of the clear file - C - said conventional byte is 67, expressed as a file of binary digits. Four correspondence rules are applied to it. These may be constituted by computer files which determine which bit of the byte is to be maintained and which is to be changed (0 to 1 and 1 to 0); or by a table which already contains at least four different coded bytes associated to each conventional one—if there are more than four, a rule having been memorized for choosing each time only four among them. For simplicity's sake, we will assume that we are using a table containing only four bytes corresponding to each conventional one and that those corresponding to C are: 173, 236, 39, 28—all expressed as files of binary digits. A matrix, the rows of which are the above four bytes, is thus constructed and is associated to the letter C. The matrix is shown in FIG. 1.

Similarly, matrices are constructed representing the remaining characters of the message. The resulting grid is the coded file. It comprises 18 matrices and is shown in FIG. 2, in which, for explanatory purposes, horizontal and vertical lines have also been drawn to indicate its separation into the said 18 matrices, although no such lines would exist in the actual operation of the invention.

Figures 1, 2:
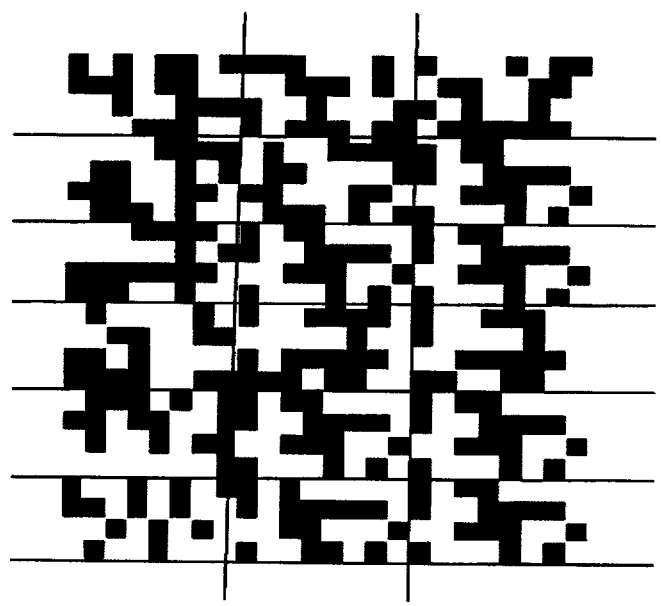
FIG. 1 is a matrix, representing, in one embodiment of the invention, an ASCII character, specifically the letter "C"
FIG. 2 is a coded file in graphic form according to an embodiment of the invention.
Figure 3:
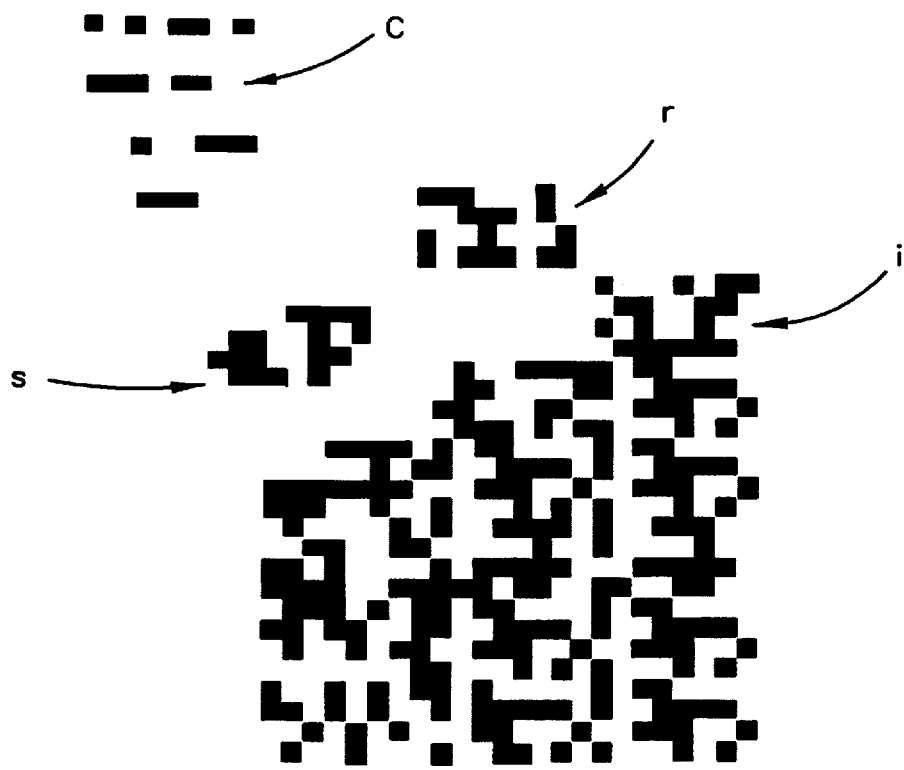
FIG. 3 is the coded file of FIG. 2, wherein certain characters have been evidenced.

For further illustration, FIG. 3 shows the grid or coded file of FIG. 1, in which the matrices signifying C, r and s are separated from the others and are indicated by arrows, as is the matrix signifying i.

Said coded file is now transmitted by fax modem. It makes no difference—and this is a feature of the invention—whether it is intended to be received by a fax or by a computer. The recipient will decide, and will connect the chosen receiving apparatus to the phone line. The transmission is exactly the same in both cases. Each ASCII character is sent in about 1/150 of a second for a modem having a rate of 9600 boudes. If for each character a number of bytes (viz. a number of rows per matrix) smaller than four is used, the transmission will be faster: if said number is two, each character will be sent in 1/300 of a second.

Figure 4:
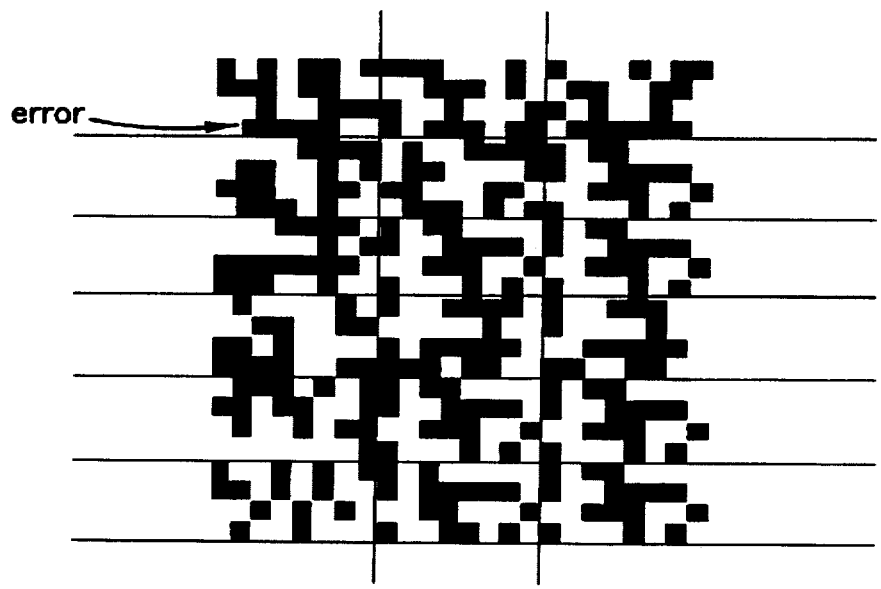
FIG. 4 is a matrix corresponding to that of FIG. 1, but having a noise in one bit.

If the receiving apparatus is a fax, the coded file is printed by it and then scanned by means of a scanner, e.g. HP Scanjet of Logiten Scanman. The results of the scanning are communicated to a decoding computer, which has stored in its memory the same correspondence rule, viz. the same files or the same table, that has been used to code the clear file, and which transforms each row of each matrix to the byte corresponding to it by applying the reverse of said correspondence rule. The computer starts this operation from the starting point of the coded file as transmitted by the scanner to the decoding computer. For each of the 5 matrices after the first it is found that in each matrix the same byte is obtained from all rows by applying the reverse correspondence rule. The conventional ASCII meaning of said bytes, which is "rist.", is therefore assumed to to be the clear meaning of the five characters after the first of the uncoded file, viz. of the reconstructed clear file. As to the first matrix, however, an error is assumed to have occurred in transmission, since the coded file appears as in FIG. 4, wherein it is apparent that the fourth row of the first matrix is 00111100 instead of 00011100 (in decimal numbers, 60 instead of 28) and by applying the reverse correspondence rule one obtains C, expressed in binary digits, from the first three lines, but a different ASCII character, say R, from the fourth. However, since three rows concur, the letter C is assumed to be correct and is registered. Of course, all characters are registered, in this stage, as ASCII symbols.

Figure 5:
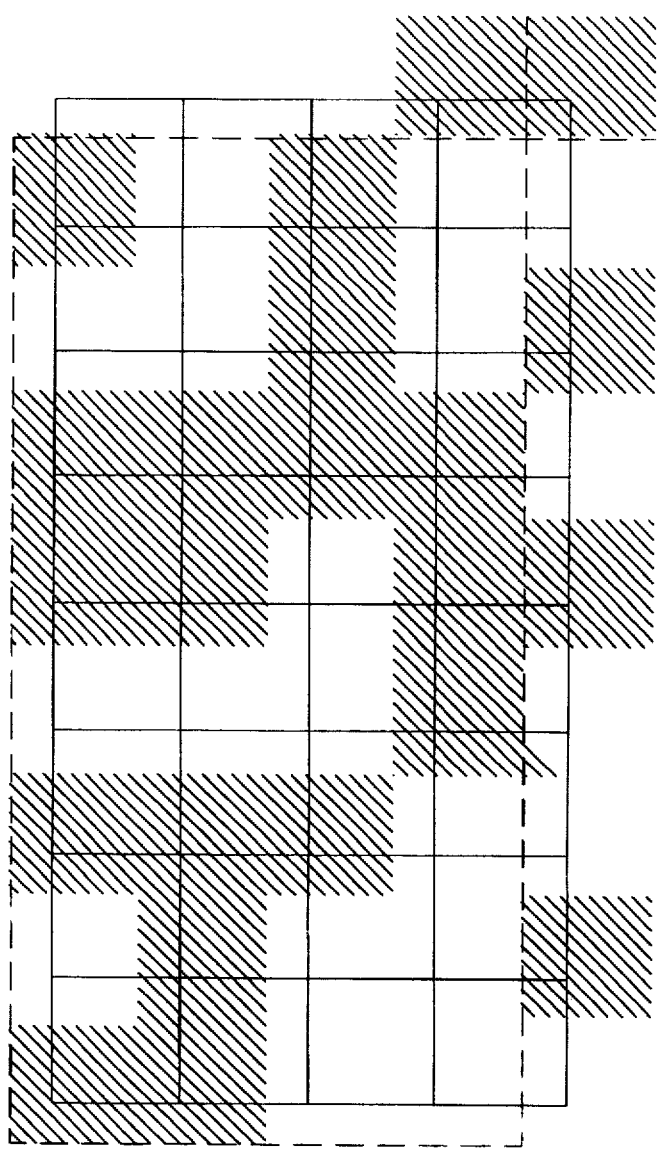
FIG. 5 illustrates the process of changing the starting point of the reading of a matrix.

However, let us assume that the grid has undergone such distortion during transmission, printing or scanning, that an entirely different matrix from the correct one is obtained. Say that this matrix, expressed in decimal numbers, is 216, 79, 27, 30. The probability in such a matrix, which is the result of statistical errors, more than two rows will agree, is practically negligible. We will then shift the point from which the reading of the coded file begins. It is to be noted that each (white or black) cell of the matrix will include, in general, a number of pixels having the same color. Their number depends on the degree of resolution of the printer and of the scanner. There may be, e.g., 4 to 16 pixels per matrix cell, but their number may be different. The point at which the reading starts is preferably shifted by one pixel (but it may be shifted by more than one) right and left and up and down. Obviously, certain pixels that had been read as belonging to the matrix under consideration will now be excluded and an equal number of pixels that had not been read as belonging to it, will not be included. Although these operations are carried out by the computer and are not actually graphic, they can be illustrated by a graphic analogy, as follows. FIG. 5 shows, at a greatly enlarged scale, a matrix that is being read, in which each cell includes nine pixels. The top row of the matrix below it (viz. the matrix located at the same position in the following row of matrices) and the bit adjacent to it (the first bit of the next matrix, the second of that row), as well as the left-hand column of the matrix to the right of it (viz. which immediately follows the one being read) are also shown. The rectangle in broken lines encloses the matrix in question. The rectangle in full lines encloses all the pixels that are read as belonging to the matrix when the starting point of the reading is shifted one pixel to the right and one pixel below and the squares enclosing the individual bits are also shown, for purposes of illustration. The matrix being read is that of FIG. 1, the meaning of which, in the correspondence rules assumed in the example, is "C". The top row of the matrix below it is 01001010. The next bit is 1. The left-hand column of the matrix to the right of the one being read is 0001. Now as far as the computer is concerned, each bit must be white or black and there is no intermediate possibility, so that it will normally interpret an array of 9 bits as 0 or 1, according to whether the majority of pixels belonging to it are white or black. Accordingly the matrix included in the full line rectangle will be read as

```
11101100
11101100
00101111
00011100
```

By comparing it with the matrix of FIG. 1, it is seen that the second and fourth row coincide and have the meaning "C" in the assumed correspondence rules, whereas the first and third rows are different and have different meanings. This character therefore cannot be accepted as having a correct meaning. But if the starting point of the reading is shifted by one pixel upwards and leftwards, the matrix of FIG. 1 is obtained and the correct meaning of the character has been found.

It has been found that in many cases such an operation will permit to find a starting point of the reading from which three or even four rows of a matrix, the rows of which were previously in complete disagreement or in insufficient agreement, do agree with one another, so that a definite meaning can be attributed to the matrix. Statistics based on experience have shown that the majority of the errors occurring in practice, whether in transmission, printing or reading, can be corrected in this manner. In this way, distortions of the matrix are compensated. This fact was wholly unexpected and the Applicant is not prepared to provide a positive theoretical explanation of it: however, he has found it to be systematically confirmed by experience.

Another advantage of the process according to the invention is that, if in a particular case, in spite of everything, a file cannot be completely interpreted with adequate assurance, it can be transmitted twice and all the character the meaning of which has been ascertained in either transmission can be combined to provide the complete message. It is extremely rare that errors should occur in two transmissions in the same characters: in fact, the probability that this occurs is practically negligible. While the transmission methods known in the art, in particular from computer to computer, do not permit to combine two transmissions, and if one is defective, it must be discarded and repeated, and the following one has the same probability of begin defective, the process according to the invention permits to retain and use all the correct portions of a first transmission and combine them with the correct portions of a second one. This fact also permits to increase transmission speed by reducing to 3 and even 2 the number of bytes in each matrix representing a character. If, when this is done, it should occur that an excessive number of characters are not read with reasonable certainty, the transmission can be repeated and the combination of the two transmissions will be successful. Thus transmission with 2 bytes per character will have a speed double that of 4-byte transmission, and only such transmissions that are unsuccessful will require a repetition which will bring the overall speed down to that of one transmission with 4-byte characters.

If the coded file, transmitted via fax modem, is received by another computer provided with a fax modem, it is not printed nor scanned, but is registered in the computer memory in a form that comes within the meaning of the expression "graphic-equivalent form", as used herein, since it contains all the information required for producing a print by means of a printer. The computer has in its memory the same data that it would have had the file been printed and scanned and the results of the scanning been transmitted to the computer. The expression "graphic-equivalent form" includes the presence in a computer memory of the same data that would had been transmitted from a scanner scanning a print of the file.

EXAMPLE 2

The same message as in Example 1 is to be transmitted. However each file unit will now be represented by an array of 24 bits. All possible arrays of 24 binary digits are $2^{24}$. Among these $2^8$ will be considered as "legitimate arrays", representing each an ASCII character. The legitimate arrays can be chosen in any desired way or according to any desired rule, though it is preferable that they be chosen in such a manner that the differences between any two of them be significant and not be limited, for instance, to one bit only. In this example, they will be chosen in such a way that there would be at least three different bits between any two legitimate arrays considered. This can be done in any desired way, e.g., by constructing a suitable table. A possible way of achieving it is the following.

Figures 6, 7:
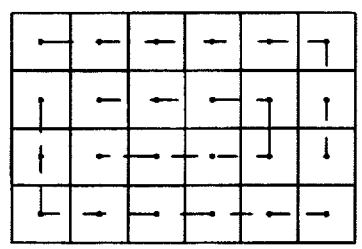
FIG. 6 illustrates the check paths of an array of bits used in another embodiment of the invention.
FIG. 7 is a matrix representing the letter "C" in said other embodiment of the invention.

Let us consider the arrays as ordered in any convenient succession, for instance, in a 6×4 matrix as shown in FIG. 6.

The matrix has four rows of six cells each. In the matrix three "check paths" are defined, in such a way that each check path connects eight cells in succession. One way is shown, by way of example, in FIG. 6. Each check path is indicated by a broken line. If we indicate each cell of the matrix, as is usual in describing matrices, by a letter having two indices, the first of which is the number of the row and the second of which is the number of the column to which the cell belongs, viz. two symbols such as "$a_{ij}$", the first path covers the first row of the matrix plus the cells $a_{26}$ and $a_{36}$, the second path covers the bottom row of the matrix plus the cells $a_{21}$ and $a_{31}$, and the third path covers the cells $a_{22}$, $a_{23}$, $a_{24}$, $a_{25}$, $a_{35}$, $a_{34}$, $a_{33}$ and $a_{32}$. The matrix is constructed so that the cells of each path will identify an ASCII character in the usual way, by eight binary digits. In this case, since at least one digit is different in the representation by binary digits of any two ASCII symbols, each legitimate matrix will differ from any other legitimate matrix by at least three binary digits.

It should be obvious that the 24 binary digits in question need not be disposed in matrix form, but may be disposed in a succession, each being identified by its position in the succession. Check paths can be easily defined in such a linear representation of the legitimate array.

Now, in transmitting the message transmitted in Example 1, the same procedure would be followed but with the following differences. To each character will be associated three 8-bit bytes, defined by any chosen correspondence rules. Assuming that the first of three correspondence rules used in Example 1 are used, character C, for example, would be defined by the first three bytes set forth in Example 1, corresponding to decimal numbers 173, 236, and 39, and these would be arranged in the matrix shown in FIG. 7.

If after the transmission a matrix is found which differs from the above one by, say, one bit, that matrix will not be a legitimate array and therefore will be meaningless. Comparing it to legitimate arrays, will show that the legitimate array representing C is the closest one, differing by only one bit, and therefore C would be accepted as the matrix' true meaning. If the closest legitimate array differed by more than one bit, the shifting of the starting point of the reading, described in Example 1, will be carried out, and an attempt will be made to find, by such shifting, a legitimate array or an array which differs from a legitimate array by only one bit.

It is clear that the way of constructing legitimate arrays, that has been described, constitutes only an example, and that $2^8$ legitimate arrays out of $2^{24}$ arrays can be defined in any desired way, constructed according to any rule, or even according to a table. Likewise, it is clear that the arrays may have less or more than 24 bits. In particular, it is obvious that if the information that must be transmitted and/or stored is such that each item of the file relating to it requires, to be defined, a number n of bits which is greater than 8, e.g. 16, a suitable multiple of n, say, mn, will be chosen and there will be $2^n$ legitimate arrays out of $2^{mn}$ possible arrays.

Suitable rules will be established to identify the legitimate arrays among all the possible arrays. One possible way, similar to that exemplified in Example 1 and in this example, would be to define in each array m check paths and require that the bytes of n bits found in each of these n check paths have the same meaning according to pre-established correspondence rules. Other ways of choosing legitimate arrays among all possible arrays can, of course, be defined.

EXAMPLE 3

A file representing a picture consists of bytes representing the pixels of the picture, each byte, comprising a number of bits depends on the type of the picture, on whether it is black and white or color, on the number of color hues that are considered as distinct, on the resolution, and so forth. However, such a file can be handled as the files referred to in the previous examples, and can be transmitted and/or stored in the same way. If a fax is used, however, it must be a color fax to print color pictures.

EXAMPLE 4

Known compression methods, such as those available in the market under the names of Zip or Arj, can be applied to the file before carrying out the process of the invention. However, the compressed file is handled by said process in exactly the same way as a non-compressed file. While all other known processes of transmission place limitation on the possible use of compression methods, the process according to the invention does not. Known compression methods will permit easily to reduce by a factor of up to 5 the number of bytes, even by much higher factors (e.g. by JPG).

If the process of the invention is applied to storage of information, the grids or arrays created according to the invention are printed on pages. In carrying the invention into practice, it is possible to store a great number of bytes in a very limited space. E.g., operating with 300 dpi printers and 300 dpi scanners or making printouts with a regular fax machine, it is possible to store more than 20,000 bytes in one page, and if a compression method has been applied and the number of bytes reduced by 5, then more than 100,000 text bytes can be stored in one page. Higher densities can be achieved by using high quality printers and scanners: e.g., 600 dpi printers and scanners will enable 4 times smaller printed areas.

EXAMPLE 5

The procedure described in the previous examples can be also carried out by magnetically registering on a magnetic medium the information which in the previous examples is assumed to be printed on paper in black and white or to be memorized by the decoding computer, or by registering on a compact disk as arrays of reflective and non-reflective dots. Therefore, the process according to the invention permits to store in magnetic disks or compact disks the files in coded form and then decoding them to reconstruct the clear files whenever desired, either immediately, as part of a transmission process, or at any later date, if the invention is essentially used for storing information. All those representations of the information are graphic-equivalent forms.

A grahic form is which information can be stored according to the invention is constituted by color prints. As known in the art, color hues may be identified each by a number of bits and $2^n$ hues can be distinguished, wherein "n" is the number of bits in each byte, said number of hues ranging, in the present state of the art, from 16 to 256 and being likely to increase in the future. Each byte in the clear file, to be transmitted and/or stored according to the invention, can be represented by a color pixel. The resulting color picture can be printed and then scanned by means of a color scanner and the information conveyed to a computer, as in the other embodiments of the invention. If the color picture is printed on a smart card, an e.g. 16 kbyte card can result. This constitutes a highly efficient embodiment of the invention.

While some embodiments of the invention have been described for purposes of illustration, it will be apparent that it can be carried out by persons skilled in the art in many different ways, and with many modifications, variations and adaptations, without departing from its spirit or exceeding the scope of the claims.

I claim:

1. A process for transmitting information, comprising the steps of:

(i) embodying said information in a first computer file including a number of bytes, wherein each of the bytes is an array comprising digital values to which a definite meaning is attributed when the digital values are taken together;

(ii) generating a coded file by applying a predetermined correspondence rule to each byte in the first computer file, wherein the coded file is comprised of coded bytes and wherein each of the coded bytes is comprised of at least one digital value;

(iii) transmitting said coded file by fax modem and receiving said coded file by a fax;

(iv) printing the received coded file on a material backing wherein each said coded byte is represented by a grid comprising black and white cells, wherein said black and white cells correspond to digital values 0 and 1 constituting said coded byte;

(v) scanning the printed coded file by means of a scanner;

(vi) communicating results of said scanning to a decoding computer; and (vii) decoding said results of said scanning into a second computer file including bytes by applying the predetermined correspondence rule in reverse to said results of said scanning, wherein each of said bytes of the second computer file is an array of digital values to which a definite meaning is attributed when the digital values are taken together.

2. Process according to claim 1, wherein said coded file is generated by applying a plurality of different predetermined correspondence rules to each byte in the first computer file.

3. Process according to claim 1, wherein
   (a) the coded file includes a number of matrices, wherein the number of matrices is same as the number of bytes in the first computer file;
   (b) each of the matrices of the coded file is constructed from a plurality of matrix rows wherein the matrix rows are generated by applying a second plurality of predetermined correspondence rules to each of the bytes of the first computer file;
   (c) the decoding of the results of the scanning is started from a starting point of the coded file as communicated by the scanner to the decoding computer;
   (d) the results of the scanning are decoded into a second computer file including a number of decoded matrices wherein each said decoded matrix includes said matrix rows, wherein for each of the decoded matrices of the second computer file, the matrix rows are produced by applying the second number of the predetermined correspondence rules in reverse to each corresponding matrix of the coded file as communicated by the scanner to the decoding computer, wherein each of the matrix rows of the second computer file is a byte comprising an array of digital values to which a definite meaning is attributed when the digital values are taken together.

4. Process according to claim 1, wherein the information embodied in the first computer file is compressed prior to embodying in the first computer file.

5. Process according to claim 1, wherein the black and white cells of the received coded file are produced on the material backing by printing a black pixel for one of the two said digital values 1 or 0 and leaving the material backing blank for the other of the two digital values 0 or 1, respectively.

6. Process according to claim 3, wherein the matrices in the coded file are transmitted in a succession determined by a corresponding succession of the bytes in the first computer file.

7. Process according to claim 3, wherein the second plurality of predetermined correspondence rules are different from one another.

8. Process according to claim 1, wherein at least one of the bytes in the first computer file defines an ASCII symbol.

9. Process according to claim 1, wherein at least one of the bytes in the first computer file is an array of bits defining position and color of a pixel.

10. Processing according to claim 2, wherein each of the black and white cells comprises at least one pixel, and wherein each said cell is determined to be black or white according to whether a majority of pixels therein are black or white, respectively.

11. Process according to claim 3, wherein for each of the decoded matrices of the second computer file, if the definite meaning for each of at least a sufficient number of the matrix rows is the same, accepting said definite meaning as the definite meaning of the corresponding byte of the first computer file.

12. Process according to claim 3, wherein for each of the decoded matrices of the second computer file, if the definite meaning for each of at least a sufficient number of the matrix rows is not the same, the decoding of the results of said scanning is started by shifting in all possible directions the starting point of the coded file as communicated by the scanner to the decoding computer, until for each said decoded matrix of the second computer file thus obtained:
   (I) if the definite meaning of each of at least a sufficient number of said matrix rows is the same, accepting said definite meaning as the definite meaning of the corresponding byte of the first computer file; or
   (II) if the definite meaning of each of at least a sufficient number of said matrix rows is still not the same, the decoded matrix is registered as erroneous and impossible to interpret as the corresponding byte of the first computer file.

13. Processing according to claim 1, wherein each of the black and white cells comprises at least one pixel, and wherein each said cell is determined to be black or white according to whether a majority of pixels therein are black or white, respectively.

14. Process according to claim 2, wherein the information embodied in the first computer file is compressed prior to embodying in the first computer file.

15. Process according to claim 3, wherein the information embodied in the first computer file is compressed prior to embodying in the first computer file.

16. Process according to claim 10, wherein the information embodied in the first computer file is compressed prior to embodying in the first computer file.

17. Process according to claim 11, wherein the information embodied in the first computer file is compressed prior to embodying in the first computer file.

18. Process according to claim 12, wherein the information embodied in the first computer file is compressed prior to embodying in the first computer file.

19. Process according to claim 13, wherein the information embodied in the first computer file is compressed prior to embodying in the first computer file.

* * * * *